United States Patent
Ruffell et al.

(10) Patent No.: US 9,453,279 B2
(45) Date of Patent: Sep. 27, 2016

(54) METHOD FOR SELECTIVELY DEPOSITING A LAYER ON A THREE DIMENSIONAL STRUCTURE

(71) Applicant: Varian Semiconductor Equipment Associates, Inc., Gloucester, MA (US)

(72) Inventors: Simon Ruffell, South Hamilton, MA (US); Thomas R. Omstead, Gloucester, MA (US); Anthony Renau, West Newbury, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 31 days.

(21) Appl. No.: 14/336,893

(22) Filed: Jul. 21, 2014

(65) Prior Publication Data
US 2016/0005607 A1    Jan. 7, 2016

Related U.S. Application Data

(63) Continuation of application No. 14/324,907, filed on Jul. 7, 2014.

(60) Provisional application No. 62/021,491, filed on Jul. 7, 2014.

(51) Int. Cl.
H01L 21/22 (2006.01)
H01L 21/225 (2006.01)
(Continued)

(52) U.S. Cl.
CPC ... *C23C 16/45536* (2013.01); *C23C 16/45551* (2013.01); *C23C 16/486* (2013.01); *C23C 16/50* (2013.01); *C23C 16/52* (2013.01);
(Continued)

(58) Field of Classification Search
CPC ............ H01L 21/2225; H01L 21/02164; H01L 21/0217; H01L 21/02211; H01L 21/02636; H01L 21/225
See application file for complete search history.

(56) References Cited

U.S. PATENT DOCUMENTS 7,297,581 B1   11/2007   Hill et al.
8,637,411 B2   1/2014    Swaminathan et al.
(Continued)

FOREIGN PATENT DOCUMENTS

KR   1020070024965 A   3/2007

OTHER PUBLICATIONS

International Search Report and Written Opinion mailed Oct. 30, 2015, in corresponding International Patent Application No. PCT/US2015/039345.

*Primary Examiner* — Dah-Wei D Yuan
*Assistant Examiner* — Kristen A Dagenais (57) ABSTRACT

A method may include providing a substrate having a surface that defines a substrate plane and a substrate feature that extends from the substrate plane; directing an ion beam comprising angled ions to the substrate at a non-zero angle with respect to a perpendicular to the substrate plane, wherein a first portion of the substrate feature is exposed to the ion beam and wherein a second portion of the substrate feature is not exposed to the ion beam; directing molecules of a molecular species to the substrate wherein the molecules of the molecular species cover the substrate feature; and providing a second species to react with the molecular species, wherein selective growth of a layer comprising the molecular species and the second species takes place such that a first thickness of the layer grown on the first portion is different from a second thickness grown on the second portion.

8 Claims, 8 Drawing Sheets (51) Int. Cl.
    *H01L 21/02* (2006.01)
    *C23C 16/455* (2006.01)
    *C23C 16/48* (2006.01)
    *C23C 16/50* (2006.01)
    *C23C 16/52* (2006.01)
    *H01J 37/32* (2006.01)

(52) U.S. Cl.
    CPC ..... *H01J37/32357* (2013.01); *H01L 21/0217* (2013.01); *H01L 21/0226* (2013.01); *H01L 21/02164* (2013.01); *H01L 21/02211* (2013.01); *H01L 21/02636* (2013.01); *H01L 21/225* (2013.01); *H01L 21/2225* (2013.01)

(56) References Cited

U.S. PATENT DOCUMENTS

| | | | |
|---|---|---|---|
| 2011/0084215 A1 | 4/2011 | Hautala et al. | |
| 2012/0248328 A1* | 10/2012 | Renau | H01J 27/024 250/398 |
| 2013/0115763 A1* | 5/2013 | Takamure | H01L 21/02129 438/513 |
| 2013/0270655 A1* | 10/2013 | Adam | H01L 29/66545 257/410 |
| 2013/0280876 A1 | 10/2013 | Tsai et al. | |
| 2014/0004689 A1 | 1/2014 | Nainani et al. | |
| 2014/0159159 A1 | 6/2014 | Steigerwald et al. | |

\* cited by examiner

METHOD FOR SELECTIVELY DEPOSITING A LAYER ON A THREE DIMENSIONAL STRUCTURE

RELATED APPLICATIONS

This application claims priority to U.S. provisional Patent application No. 62/021,491, filed Jul. 7, 2014, and further claims priority to U.S. patent application Ser. No. 14/324,907, filed Jul. 7, 2014.

FIELD

The present embodiments relate to substrate processing, and more particularly, to processing apparatus and methods for depositing layers by atomic beam or molecular beam deposition.

BACKGROUND

Many devices including electronic transistors may have three dimensional shapes that are difficult to process using conventional techniques. The topology of such devices may be up-side down, re-entrant, over-hanging, or vertical with respect to a substrate plane of a substrate in which such devices are formed. In order to process such devices such as to grow layers on such topology, improved techniques may be useful that overcome limitations of conventional processing. For example, doping of substrates is often performed by ion implantation in which substrate surfaces that may be effectively exposed to dopant ions are limited by line-of-site trajectories of the ions. Accordingly, vertical surfaces, re-entrant surfaces, or over-hanging surfaces may be inaccessible to such dopant ions. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment a method may include providing a substrate having a surface that defines a substrate plane and a substrate feature that extends from the substrate plane. The method may also include directing an ion beam comprising angled ions to the substrate at a non-zero angle with respect to a perpendicular to the substrate plane, wherein a first portion of the substrate feature is exposed to the ion beam and wherein a second portion of the substrate feature is not exposed to the ion beam. The method may also include directing molecules of a molecular species to the substrate wherein the molecules of the molecular species cover the substrate feature, and providing a second species to react with the molecular species, wherein selective growth of a layer comprising the molecular species and the second species takes place such that a first thickness of the layer grown on the first portion is different from a second thickness grown on the second portion.

In a further embodiment, a method of selectively doping a three dimensional substrate feature on a substrate may include directing an ion beam comprising angled oxygen ions to the substrate at a non-zero angle with respect to a perpendicular to a substrate plane, wherein a first portion of the substrate feature is exposed to the ion beam and wherein a second portion of the substrate feature is not exposed to the ion beam. The method may also include directing molecules of a molecular species that includes a dopant species to the substrate wherein the molecules of the molecular species cover the substrate feature, wherein the directing the ion beam and directing the molecules generates selective growth of a dopant oxide layer comprising the dopant on the first portion but not on the second portion.

In an additional embodiment, a method of selectively doping a three dimensional substrate feature on a substrate may include exposing the substrate to an oxide plasma wherein the substrate feature is covered with a sub-monolayer of oxygen. The method may also include directing an ion beam comprising angled ions to the substrate at a non-zero angle with respect to a perpendicular to a substrate plane, wherein a first portion of the substrate feature is exposed to the ion beam and wherein a second portion of the substrate feature is not exposed to the ion beam, wherein the sub-monolayer of oxygen is removed in the first portion and the sub-monolayer of oxygen remains in the second portion. The method may also include directing molecules of a molecular species that includes a dopant to the substrate wherein the molecules of the molecular species cover the substrate feature, wherein the directing the ion beam and directing the molecules generates selective growth of a dopant oxide layer comprising the dopant on the second portion but not on the first portion.

DETAILED DESCRIPTION

The present embodiments are related to techniques for processing a substrate including forming thin layers on substrate features of a substrate. The substrate features of the substrate may extend from a substrate plane, and may form such structures as three dimensional lines, fins, pads, pillars, walls, trenches, holes, domes, bridges, cantilevers, other suspended structures, and the like. The embodiments are not limited in this context. Moreover, these features may be collectively or individually referred to herein as a "three dimensional" feature or features. A thin layer that is formed on a substrate feature may be a layer provided for doping, insulation, for encapsulation, or for other purposes.

In various embodiments, a thin layer may be formed by a modified atomic layer deposition or by modified molecular layer deposition process, which techniques may share characteristics common to conventional atomic layer deposition (ALD) or conventional molecular layer deposition (MLD) except where otherwise noted. The present embodiments provide novel improvements over conventional ALD and MLD that facilitate formation on three dimensional substrate features in which surface topography may be severe, such as that described above.

In some embodiments, such as formation of a doping layer using ALD or MLD, a series of operations may be performed in which multiple layers are formed on substrates that may include three dimensional features. In addition, the formation of each layer may involve multiple operations such as those characteristic of an ALD or MLD process. In one implementation for doping a substrate using a deposited layer formed by ALD or MLD, a surface of the substrate feature may first be cleaned to remove native oxide, which may involve providing a plasma using such species as hydrogen, oxygen, and/or ammonia radicals and molecular hydrides such nitrogen triflouride, arsine, and phosphine.

Secondly, a conformal plasma enhanced atomic layer deposition of dopant oxides may be performed to form a dopant oxide layer on a substrate feature. This ALD process may involve deposition of species that include arsenic, boron, phosphorus, arsenic oxide, phosphorus oxide, boron oxides and/or doped silicon oxides such as silicon arsenic oxide, silicon phosphorus oxide, and silicon boron oxides. In particular, these oxides may be deposited using molecular precursors such as arsine, phosphine, and diborane together with plasma-generated atomic beams that contain hydrogen, oxygen, nitrogen, and/or ammonia.

In a subsequent operation, a sealing layer such as silicon nitride may be deposited using a combination of a molecular beam containing silane, for example, and another beam containing nitrogen, hydrogen, and/or ammonia. Once the native oxide is removed from a substrate feature to be doped and the dual layer of dopant oxide and sealing nitride is deposited dopants from the dopant oxide layer may be driven into the substrate feature using a known technique such as rapid thermal annealing.

In various embodiments of the disclosure, a layer or plurality of layers may be selectively formed on a substrate feature in a manner that the selectively formed layer has a first thickness in a first portion of the substrate feature that is different than a second thickness of the layer in a second portion of the substrate feature. For example, in an application for doping just a target portion of a three dimensional substrate feature, a selectively grown layer comprising a selectively grown dopant oxide material may be deposited to a target thickness on a first, target portion of the three dimensional substrate feature, while on a second portion of the substrate feature outside of the target portion, the dopant oxide material may be thinner or non-existent. In this manner, when the selectively grown layer is annealed to drive in dopants, just a region of the substrate feature that is adjacent the target portion may be doped, thus forming a selectively doped region.

In various embodiments of the disclosure, as detailed below, this selective deposition is facilitated by the use of angled ions that can be selectively directed to a first portion or target portion of a substrate feature without impinging on portion(s) of the substrate feature outside of the target portion. The directing of angled ions may be used in conjunction with other operations to create novel ALD or MLD processes that selectively grow a layer or plurality of layers on a three dimensional substrate feature without the use of a mask. As used herein, unless otherwise noted or qualified by the context, the term "layer" may refer to a sub-monolayer, a monolayer of a material, or may refer to a thin coating or film that has the thickness of many monolayers. Thus, in some instances, a selectively grown "layer" may be composed of a single monolayer that is formed over target portions of a substrate or may be composed of multiple monolayers. Moreover, consistent with various embodiments of the disclosure, a layer that has the thickness of many monolayers may be formed in a monolayer-by-monolayer-by-monolayer fashion as in conventional ALD or MLD processes. However, the present embodiments also cover selective growth of layers having the thickness of multiple monolayers in which a layer is not grown in a monolayer-by-monolayer fashion.

Figure 1A:
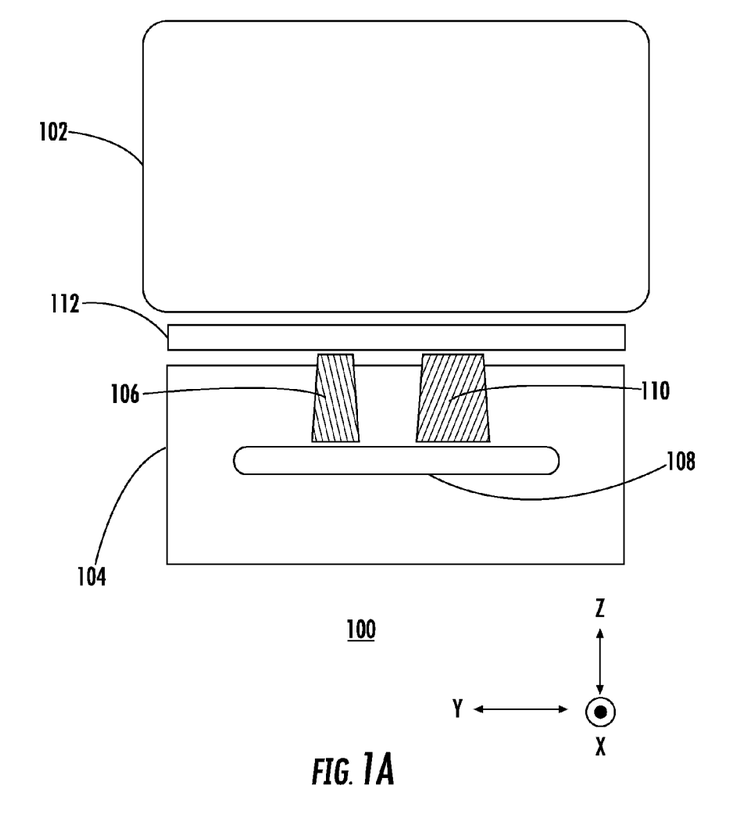
FIG. 1A depicts a processing apparatus according to embodiments of the present disclosure.

FIG. 1A depicts a processing apparatus 100 arranged according to various embodiments of the disclosure. The processing apparatus 100 may be employed to selectively grow a layer on a three dimensional structure. The processing apparatus 100 includes a source assembly 102 and a process chamber 104 adjacent the source assembly. The source assembly 102 may include a plasma chamber (not separately shown) that generates a plasma from which angled ions 106 may be extracted and provided to a substrate 108 disposed in the process chamber 104. The source assembly 102 may further include a molecular source (not shown) that may provide a molecular beam of a molecular species 110, which may be unionized, to the substrate 108. It is to be noted that the molecular beam 110 may be composed of molecules that stream toward the substrate 108 in a manner characteristic of a neutral gas, and therefore may not exhibit directionality that is characteristic of the angled ions 106. In some embodiments, the source assembly 102 may include additional plasma sources which may provide additional ions (not shown) to the substrate 108 in an angled or non-angled manner. The source assembly 102 may further include an additional molecular source(s) (not shown) to provide additional molecular species to the substrate 108. As detailed below, in some embodiments, the angled ions 106 and molecular species 110 may be provided in a manner that selectively promotes atomic layer-by-atomic layer growth of an overall layer in certain portions of a substrate, where the regions in which layer-by-layer growth takes place may experience growth similar to that provided by conventional ALD or MLD techniques. In other embodiments, the angled ions 106 and molecular species 110 may be provided in a manner that inhibits such atomic layer-by-atomic layer growth in regions impacted by the angled ions 106. Thus, unlike conventional ALD or MLD techniques that may produce blanket, non-selective growth, the processing apparatus 100 facilitates selective deposition of layers that may be formed in a monolayer-by-monolayer fashion. This is accomplished by the treatment of a substrate with a combination of angled ions and molecules of a molecular species.

As detailed below, in different implementations the angled ions may be inert ions or reactive ions.

As further illustrated in FIG. 1A an assembly 112 is disposed between the source assembly 102 and process chamber 104. The assembly 112 may be composed of at least one plate or structure that provides gas communication between sources in the source assembly 102 and process chamber 104. For example, the assembly 112 may be composed of an extraction plate that is used to extract angled ions 106 from a plasma chamber and a showerhead or similar structure used to stream molecular species 110 to the substrate 108.

Figure 1B:
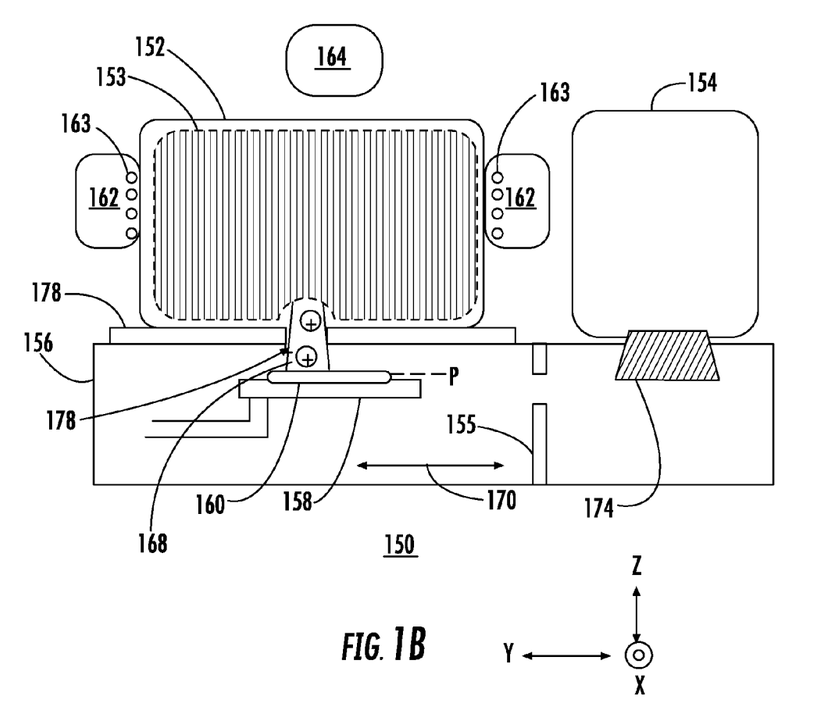
FIG. 1B and depicts details of another processing apparatus according to additional embodiments of the disclosure.

FIG. 1B depicts another processing apparatus 150 according to additional embodiments of the disclosure. The processing apparatus 150 includes a plasma chamber 152 to form a plasma 153, a molecular source 154 to supply molecular species, and a process chamber 156 to house a substrate holder 158, which is configured to support or hold a substrate 160. The processing apparatus 150 also includes a plasma source 162, which may include a plasma chamber power supply and applicator 163 or electrode to generate a plasma according to known techniques. For example, the plasma source 162 may, in various embodiments, be an in situ source or remote source, an inductively coupled plasma source, capacitively coupled plasma source, helicon source, microwave source, arc source, or any other type of plasma source. The embodiments are not limited in this context. When gas is supplied by gas source 164 to the plasma chamber 152 the plasma source 162 may ignite the plasma 153 as illustrated. The plasma 153 may supply angled ions of a first species in the form of an ion beam 168 to aid is selective deposition of a layer on a substrate feature.

The term "angled" ions as used herein refers to an assemblage of ions such as ions in an ion beam, at least some of which are characterized by trajectories that have a non-zero angle of incidence with respect to a perpendicular to a plane P of substrate 160, as illustrated in FIG. 1B. For example, with reference to the Cartesian coordinate system shown, angled ions may have trajectories that form a non-zero angle with respect to the Z-axis.

In some embodiments, the substrate holder 158 may be movable with respect to at the plasma chamber 152 at least along a direction 170 that is parallel to the Y-axis. In this manner, the substrate 160 may be moved from a position adjacent the plasma chamber 152 to a position adjacent the molecular source 154. Because of this movement, the substrate 160 may be alternately exposed to the ion beam 168 and molecular beam 174 which may form when molecules stream out of the molecular source 154. As detailed below, this may result in monolayer-by-monolayer selective growth of a material in target portions of a three dimensional substrate feature. As shown in FIG. 1B, it is to be noted that physical isolation may be provided between different portions of the process chamber 156 so that species from the plasma chamber 152 are kept from the substrate 160 when the substrate 160 is adjacent the molecular source 154 and species from species from molecular source 154 are kept from the substrate 160 when the substrate 160 is adjacent the plasma chamber 152. This is shown as the isolation wall 155.

In various embodiments, processing apparatus such as the processing apparatus 100 and processing apparatus 150 may be operated at pressure ranges that are lower than many conventional MLD or ALD systems. Exemplary pressure ranges include 1 to 100 mTorr, at which pressure range a beam of ions may be directed to a substrate without sustaining multiple collisions among ions before impacting a substrate. This facilitates the ability to direct angled ions along fixed trajectories to target portions of a substrate feature that allow selective deposition of a layer as detailed below. Although FIG. 1B illustrates a processing apparatus 150 in which a plasma chamber and molecular source are separate, in various additional embodiments a source of angled ions such as a plasma chamber and a source of a molecular beam may be collocated such that angled ion species and molecular species may be provided to the substrate to generate selective growth on substrate features without movement of the substrate.

Figure 2A:
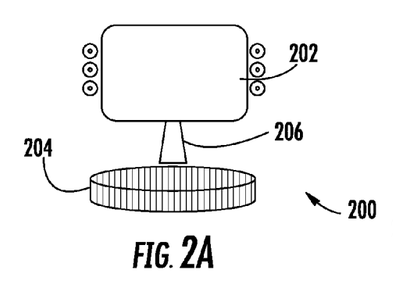
FIGS. 2A to 2D depict a sequence of operations for selective growth of a layer using a processing apparatus according to embodiments of the disclosure.
Figure 2B:
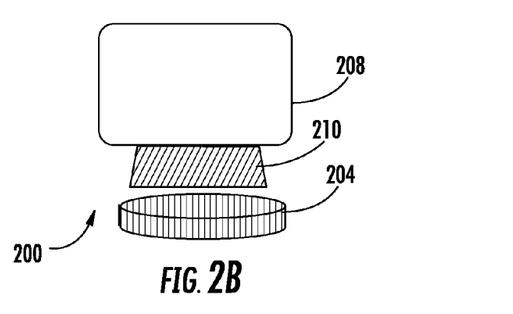
Figure 2C:
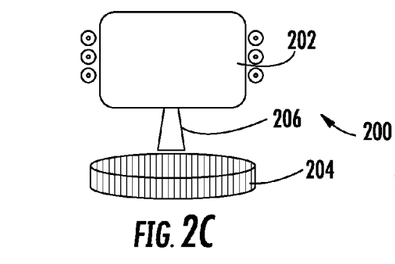
Figure 2D:
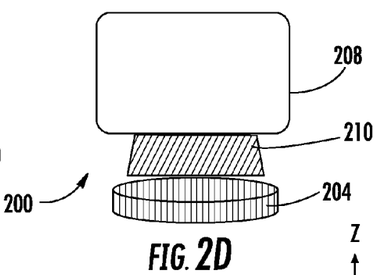
Figure 2E:
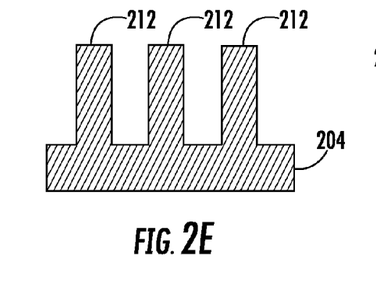
FIG. 2E illustrates a close-up of a portion of a before processing according to the operations of FIGS. 2A to 2D.
Figure 2F:
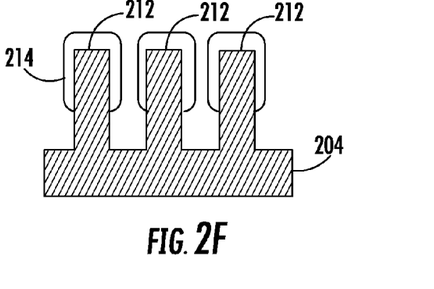
FIG. 2F depicts the state of the substrate of FIG. 2E after processing through the sequence of operations of FIGS. 2A to 2D.

FIGS. 2A to 2D depict a sequence of operations for selective growth of a layer using a processing apparatus 200 according to embodiments of the disclosure. In this example, for the purposes of illustration, the processing apparatus 200 is shown in FIG. 2A to include a plasma chamber 202 that may provide angled ions to a substrate 204 in the form of an ion beam 206. The processing apparatus 200 is also shown in FIG. 2B to include a molecular source 208 that may provide a molecular beam 210. As noted previously such a molecular beam may be composed of molecules that stream toward the substrate 204 in an undirected fashion. FIG. 2E illustrates a close-up of a portion of the substrate 204 that shows substrate features 212 before processing. The illustration in FIG. 2F depicts the state of the substrate 204 including substrate features 212 after processing through the sequence of operations of FIGS. 2A to 2D. In particular examples, the substrate features 212 may constitute fin structures from which fin-type field effect transistors (finFETs) are to be formed. As shown in FIG. 2A and FIG. 2B, for example, the substrate 204 may be sequentially subjected to the ion beam 206 that directs angled ions to the substrate 204, and also to molecular beam 210. This sequence of operations may constitute a process cycle that is used to form a layer of a material, such as a monolayer of a dopant oxide. This sequence of operations as illustrated in FIGS. 2A and 2B may be repeated in at least one additional process cycle such as shown in FIGS. 2C and 2D to form an additional layer of material or monolayer of material. In particular, angled ions of the ion beam 206 may selectively impinge on certain portions of the substrate features 212 and may be prevented from impinging on other portions of the substrate features 212, as discussed in more detail below with respect to FIGS. 3A to 4C. In conjunction with the molecules provided by the molecular beam 210, a result of this selective processing may be formation of selective layers 214, which form just on upper portions of the substrate features 212. An advantage of this approach is that this selective formation of selective layers 214 may facilitate selective doping of the upper portions of substrate features 212 without the use of masks.

In additional embodiments, instead of a molecular source, a remote plasma source may be used to provide radical species that are provided to a substrate 204 in an alternating fashion with a directed ion beam that provides angled ions, in order to generate selective formation of layers in desired portions of substrate features.

Figure 3A:
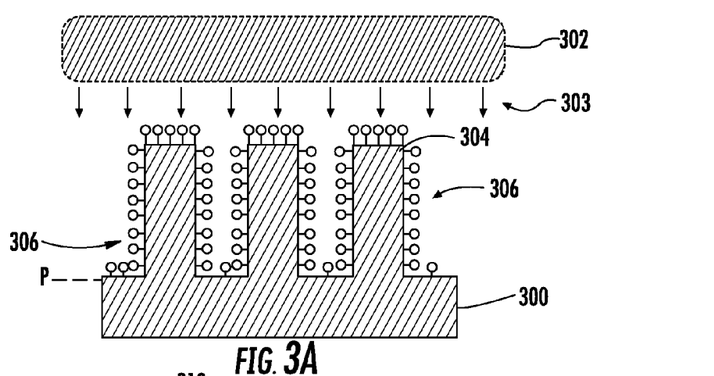
FIGS. 3A to 3C illustrate exemplary operations involved in selective deposition of a layer in which angled ions are used to suppress deposition in impacted portions of substrate structures.
Figure 3B:
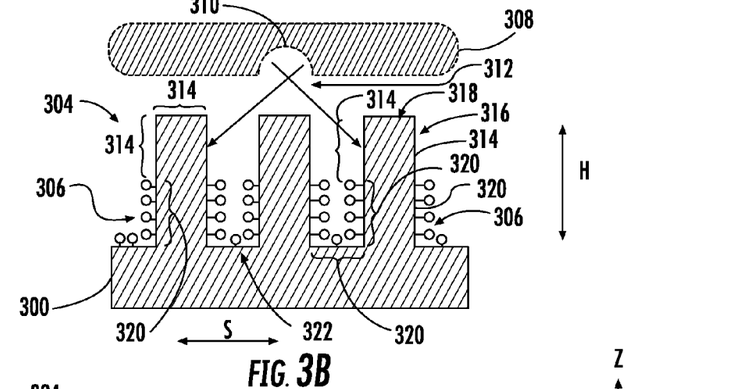
Figure 3C:
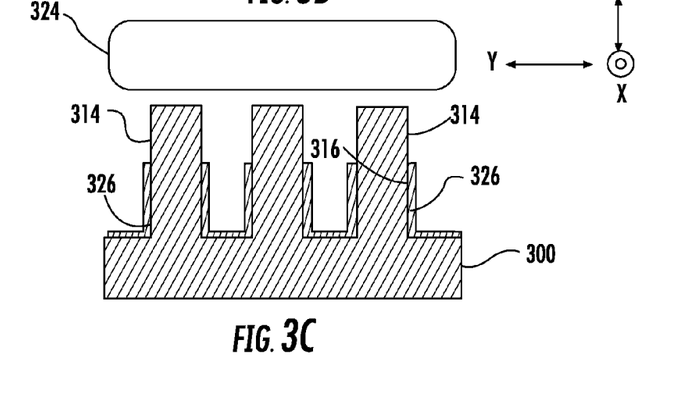

In accordance with different embodiments of the disclosure, angled ions may be used to selectively increase layer deposition or selectively suppress layer deposition in regions which are impacted by the angled ions. FIGS. 3A to 3C illustrate exemplary operations involved in selective deposition of a layer in which angled ions are used to suppress deposition in exposed portions of substrate structures. For purposes of illustration it may be assumed that the layer to be grown is silicon oxide. However, in other examples, the layer to be grown may be a dopant oxide that includes dopants such as boron, phosphorous or arsenic. In FIG. 3A there is shown an instance in which a substrate 300 is exposed to reactive ions 303 that may be extracted from a plasma 302. The substrate 300 includes substrate features 304, which extend from a plane P of the substrate as shown. The reactive ions may be oxygen, which form a sub-monolayer 306 on surfaces of the substrate features 304. In the context of forming a compound material by ALD or MLD where the compound material comprises two or more different elements such as silicon oxide, a sub-monolayer may denote a layer of a first element that may react with a layer of a second element to form a monolayer of the compound. For example, during deposition of a binary compound such as silicon oxide the layer to be formed is deposited by the repetition of two different half-cycles. After each half-cycle, a fixed amount of reactive species supplied by a first precursor remains on the substrate surface. Ideally, though not necessarily, a single monolayer of a first species may be produced after a first half cycle. In the present context, this single monolayer of a first species of a compound to be formed is referred to as a "sub-monolayer" because the full monolayer of the compound requires the addition of second species to react with the first species. Thus, atoms of the sub-monolayer of first species may be reacted with atoms or molecules of the second species supplied in the next half cycle. In each half-cycle, subsequent to supplying a given species, a purge can be performed to remove any unreacted species of the depositing material. The total amount of material reacted in a cycle may thus be equivalent to a sub-monolayer of each of the first species or second species.

In a particular example, in embodiments in which the substrate 300 is a semiconductor substrate such as silicon or silicon:germanium, the sub-monolayer 306 may be composed of oxygen that is bonded to surface silicon atoms of the substrate 300 and may subsequently react with a sub-monolayer of silicon-containing molecules to form a monolayer of silicon oxide.

In FIG. 3B there is shown a subsequent operation in which angled ions 312 are directed to the substrate 300 when the substrate features 304 are covered with the sub-monolayer 306. Referring again to FIG. 1B, the angled ions 312 may be generated when ions such as hydrogen ion are extracted from a plasma such as through an extraction aperture 176 of an extraction plate 178. Known extraction plates may modify a plasma sheath boundary in the region adjacent an extraction aperture. This may cause a curvature in the plasma sheath boundary that causes at least some ions to exit the plasma over angle(s) that are not perpendicular to a substrate plane, for example. This is shown for the plasma 308, which for simplicity is depicted without structural features of a plasma chamber, such as the aforementioned extraction plate 178. As illustrated, a curved plasma sheath boundary region 310 may form next to an extraction aperture (not shown), leading to the generation of the angled ions 312. It is to be noted that the angled ions 312, although depicted in a pair of trajectories, may be characterized by an ion angular distribution. The term "ion angular distribution" refers to the mean angle of incidence of ions in an ion beam with respect to a reference direction such a perpendicular to a substrate, as well as to the width of distribution or range of angles of incidence centered around the mean angle, termed "angular spread" for short. In some examples, the ion angular distribution may be a single mode in which the peak in number of ions as a function of incidence angle is centered around a perpendicular to the plane P. In other examples, the ion angular distribution may involve a mean angle that forms a non-zero angle with respect to a perpendicular to the plane P of the substrate 300. In particular examples, the ion angular distribution of angled ions 312 may be a bimodal distribution of angles of incidence. For example, the angled ions 312 in the example of FIG. 3B may have trajectories where the greatest number of trajectories are centered at two angular modes. In various embodiments, by controlling apparatus settings such as plasma power, plasma chamber pressure, and so forth, the separation between peaks of a bimodal distribution may be varied. For example, the peak angles may set at angles between +/−15 degrees with respect to perpendicular to the plane P, +/−30 degrees with respect to perpendicular, +/−45 degrees with respect to perpendicular, or +/−75 degrees with respect to perpendicular, to illustrate a few examples. However, the embodiments are not limited in this context.

As a result, the angled ions 312 may impact a first portion of the substrate features, which may be termed an exposed portion 314 of the substrate features 304, and which includes upper regions of sidewalls 316 as well as top surfaces 318. In some examples, the angled ions 312 may be hydrogen ions that are effective to react with oxygen to remove the oxygen in the exposed regions according to the reaction 2H+O>$H_2O$. In some examples the angled ions may be inert gas ions. The angled ions 312 may be provided at an ion energy and ion dose that is effective to remove the oxygen species that constitute the sub-monolayer 306 in the exposed portion 314 as shown. However, due to the three dimensional nature of the substrate features 304, the angled ions 312 may be shadowed from impacting certain regions of the substrate features, which are shown as a second portion of the substrate features 304 that may be termed an unexposed portion 320. For example, a first substrate feature may be shadowed by adjacent substrate features such that upper portions of the adjacent substrate features block angled ions 312 from impacting lower portions of the first substrate feature. For example, depending upon the angle(s) of incidence of angled ions 312, the spacing S between adjacent substrate features, and the height H of substrate features 304, the extent of the unexposed portion 320 may vary. The unexposed portion 320—may include lower regions of the sidewalls 316 as well as lower surfaces 322, as shown. Accordingly, the sub-monolayer 306 may remain intact in the unexposed portion 320.

Figure 3D:
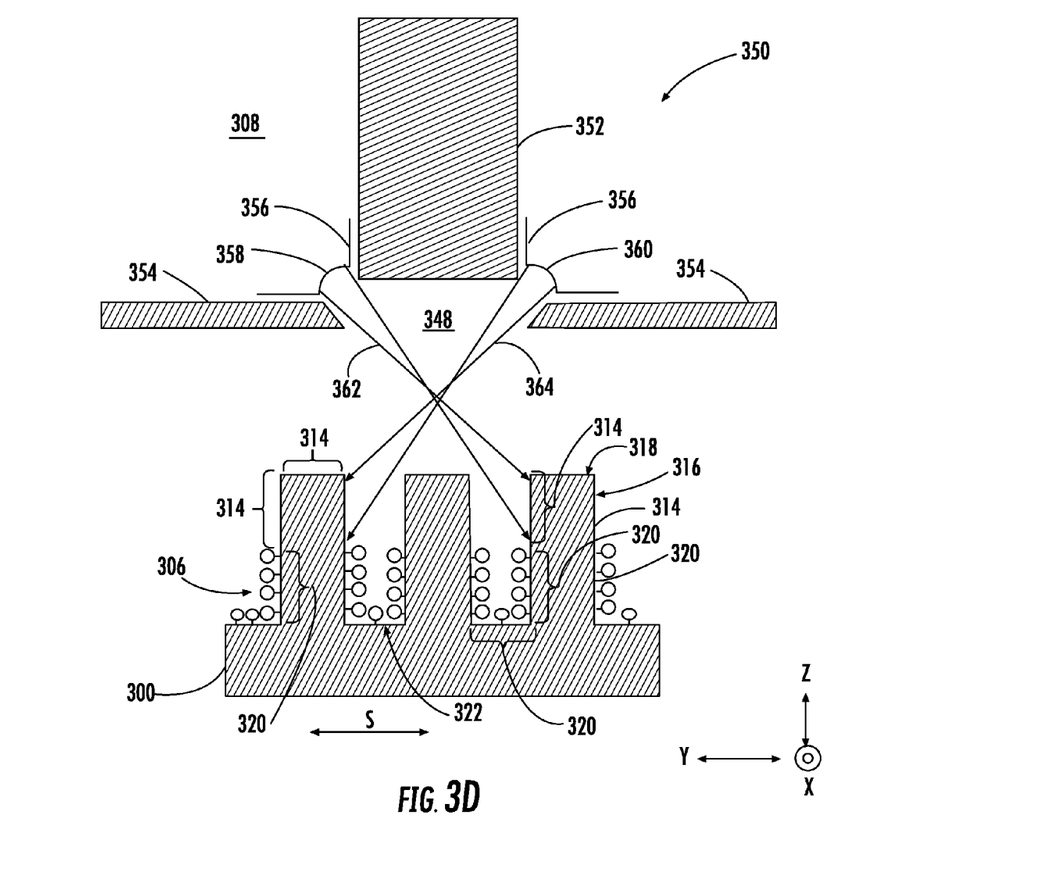
FIG. 3D depicts an alternative implementation of the operation of FIG. 3B.

In some implementations a beam blocker (not shown) may be positioned inside a plasma chamber adjacent an extraction aperture, which may have the effect of creating a pair of angled ion beams that may constitute a bimodal distribution of ions. FIG. 3D depicts an alternative implementation of the operation of FIG. 3B. In this implementation an extraction apparatus 350 is employed to extract ions from the plasma 308 and direct the ions to the substrate 300. As illustrated the extraction apparatus 350 includes an extraction plate 354 that defines an extraction aperture 348. A beam blocker 352 is disposed adjacent the extraction aperture and within a plasma chamber (not shown). The beam blocker 352 and extraction plate 354 together modify the shape of a plasma sheath boundary 356 such that two menisci are formed, shown as the meniscus 358 and meniscus 360. Ions that exit the plasma 308 from the meniscus 358 form the ion beam 362, while ions that exit the plasma 308 from the meniscus 360 form the ion beam 364. These two ion beams may strike the exposed portions 314 of the substrate features 304 and prevent formation of a sub-monolayer in the manner as described above with respect to angled ions 312.

For a fixed set of substrate features in which the relative size, shape and spacing of substrate features does not vary, in order to vary the extent of the unexposed portion 320 in which the sub-monolayer 306 remains intact, the gas pressure in a plasma chamber, plasma power, width of extraction aperture, among other features may be varied. These variations may vary the shape of plasma sheath boundary region which in turn may alter the ion angular distribution of the angled ions.

In a subsequent operation shown in FIG. 3C a molecular beam 324 may be provided to the substrate 300. The molecular beam 324 may be provided in a manner that species of the molecular beam 324 impact all surfaces of the substrate features 304. In the example of selective formation of silicon oxide, the molecular beam 324 may be composed of silane ($SiH_4$) molecules or other silicon-containing molecules that are configured to react with the oxygen species of sub-monolayer 306. The reaction of silane with oxygen in the sub-monolayer 306 may result in the formation of a monolayer of silicon oxide that adheres to the substrate 300. The operations shown in FIGS. 3A, 3B and 3C may be repeated to form additional monolayers. In this manner, a selective layer 326 composed of silicon oxide may be formed in the unexposed portion 320 of the substrate features. However, in the exposed portion 314, which is depleted of oxygen, a silicon oxide layer may fail to form since the required oxygen is not present, or the amount of silicon oxide formed may be reduced in proportion to the reduction of oxygen in the exposed portion 314.

In other embodiments, the sequence of operations shown in FIGS. 3A-3B may generally be followed except that instead of an oxygen plasma, a nitrogen plasma may be provided to form a sub-monolayer of nitrogen, which may then be selectively removed in portions that are exposed to angled ions. Subsequently a silicon nitride monolayer may be formed by exposure to silane molecular beam, for example. The same applies for selective formation of a dopant oxide material, in which a molecular beam of dopant-containing molecules may be provided instead of silane to react with a sub-monolayer of oxide that remains on a second portion or unexposed portion of a substrate feature.

Figure 4A:
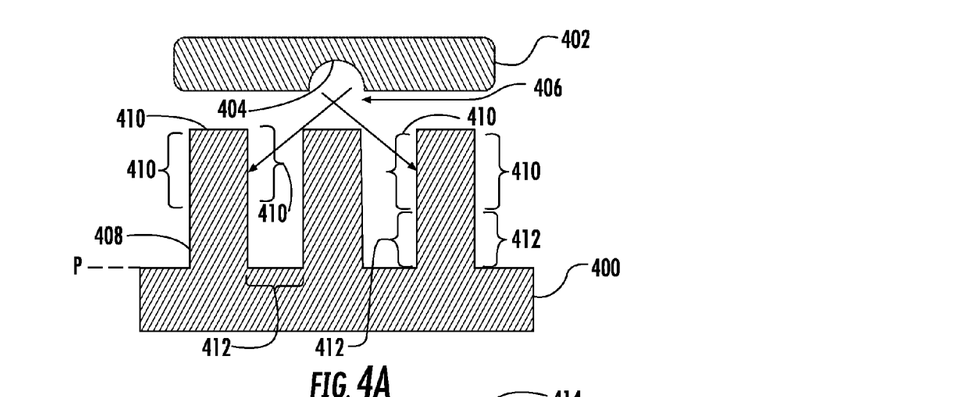
FIGS. 4A to 4C illustrate exemplary operations involved in selective deposition of a layer in which angled ions are used to enhance deposition in impacted portions of substrate structures.
Figure 4B:
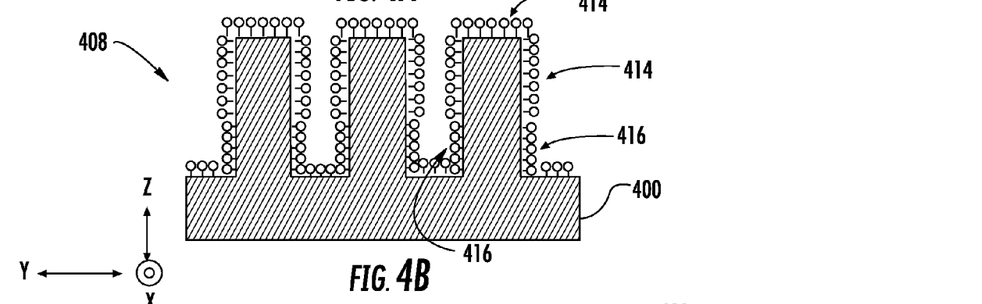
Figure 4C:
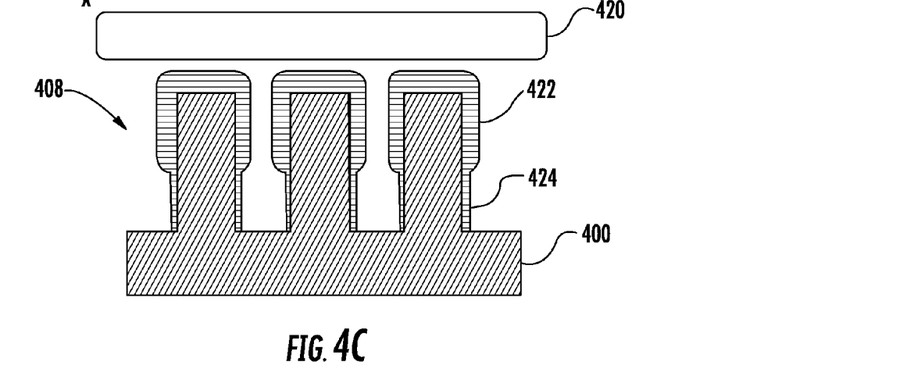

FIGS. 4A to 4C illustrate exemplary operations involved in selective deposition of a layer in which angled ions are used to enhance deposition in impacted portions of substrate structures. For purposes of illustration it may be assumed that the layer to be grown is also silicon oxide. In the operation shown in FIG. 4A, it may be assumed that an oxygen plasma 402 is generated in an apparatus that includes an extraction plate that generates a curved plasma sheath boundary region 404. As illustrated, angled ions 406, which may be oxygen ions, are extracted and directed to the substrate 400. The substrate 400 is characterized by substrate features 408, which extend from the plane P as shown. The angled ions 406 may impact the exposed portion 410 that lies in upper surfaces and upper regions of the sidewalls of the substrate features 408. The unexposed portion 412 may be unimpacted by the angled ions 406. Accordingly, as shown in FIG. 4B, a sub-monolayer 414 of oxide may form in the exposed portion 410. In some circumstances, the unexposed portion 412 may still be exposed to some oxygen when the angled ions 406 are directed to the substrate 400. In this manner, some oxygen ions may form a depleted oxygen sub-monolayer 416, which contains fewer oxygen species per unit area as compared to sub-monolayer 414. For example, the depleted oxygen sub-monolayer 416 may contain 80% or 90% fewer oxygen species as compared to sub-monolayer 414.

Turning now to FIG. 4C there is shown a subsequent operation in which a molecular beam 420 is provided to the substrate 400. In this operation, the molecular beam 420, which may be silane, may react with any oxygen species present on the substrate features 408. Thus, a monolayer 422 of silicon oxide may form in exposed portion 410 while less than a monolayer deposit, shown as layer 424 may form on unexposed portion 412. By proper adjustment of experimental conditions it may be possible to completely suppress oxygen formation in the unexposed portion 412, such that a silicon oxide layer is just selectively deposited on the exposed portion 410.

Figure 5A:
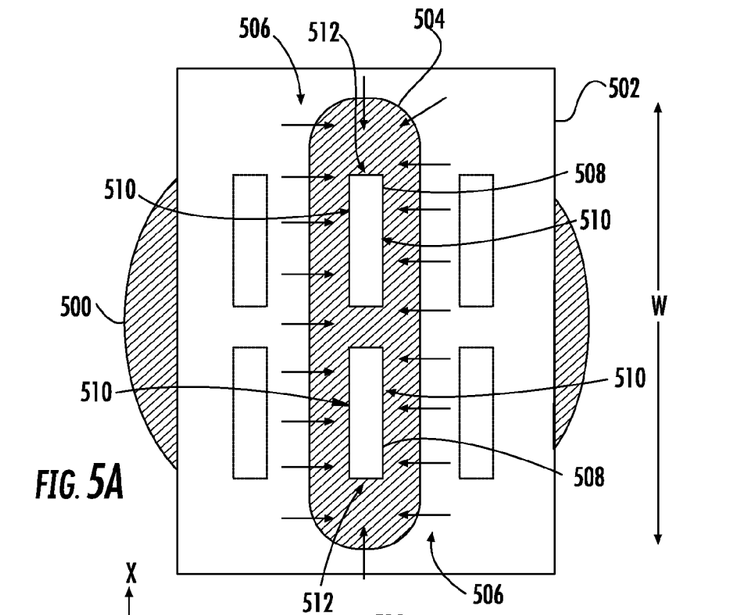
FIG. 5A is a top plan view of a substrate and extraction plate that is used to provide an ion beam to a substrate for a selective deposition process.

In various additional embodiments an extraction plate may be arranged to provide additional selectivity for ALD growth in which monolayer growth may be restricted to certain sides of a substrate feature as well as certain regions or portions of a given side of a feature. In these embodiments, a sidewall of a given substrate feature may constitute a first portion that receives angled ions, while an endwall of the substrate feature may constitute a second portion that does not receive angled ions. FIG. 5A is a top plan view of a substrate 500 and extraction plate 502 that is used to provide angled ions to the substrate as part of a selective deposition process for monolayer-by-monolayer growth. The extraction plate 502 includes an extraction aperture 504 that is elongated along the X-axis. The extraction aperture 504 may, for example, extend over an entire width W of the substrate 500 along the X-axis so that ions may be directed along the entire width W at a given instance. By scanning the substrate 500 along the Y-axis with respect to the extraction aperture 504, ions may be provided over the entire substrate.

In FIG. 5A, and ion beam 506 may be extracted through the extraction aperture 504 and directed toward the substrate 500 (into the page of FIG. 5A). The ion beam 506 is illustrated by different arrows whose trajectories illustrate exemplary trajectories of the ion beam as projected in the X-Y plane. It is to be noted that the ions of ion beam 506 may be angled with respect to the Z-axis as in FIG. 4A. As shown, a majority of the trajectories of ions of the ion beam 506 are aligned parallel to the Y-axis. A set of substrate features 508 are illustrated that have a sidewall 510 and an endwall 512 that extends perpendicularly to the sidewall 510.

Ions having the trajectories oriented parallel to the Y-axis may impinge upon sidewalls 510 of substrate features 508, which are oriented parallel to the X-axis. In contrast, the endwalls 512 of the substrate features 508, which are oriented parallel to the Y-axis, may receive little or no ion bombardment.

Figure 5B:
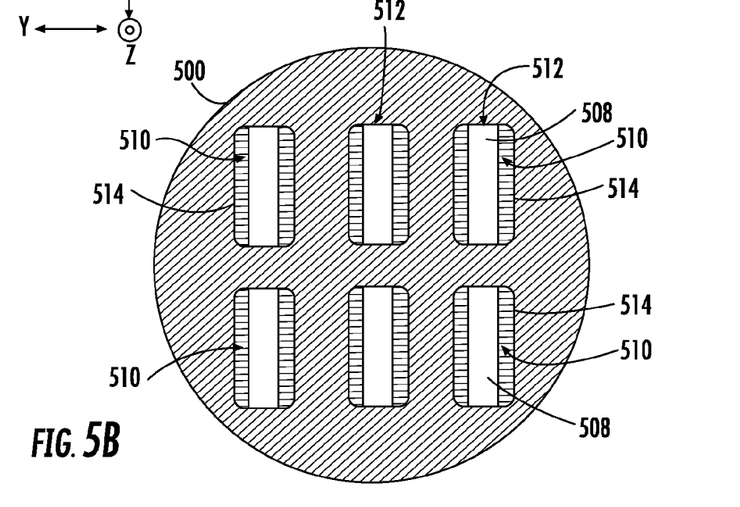
FIG. 5B is a top plan view of the substrate of FIG. 5A after provision of a molecular beam subsequent to the ion beam.

In the case where the ion beam 506 comprises angled ions that are effective to enhance monolayer growth, as in FIG. 4A, growth may therefore be selectively enhanced along sidewalls 510 over endwalls 512. Thus, a molecular beam that reacts with portions of the substrate features 508 that received ion bombardment from ion beam 506 may be provided in an additional operation, as generally depicted in 4C. FIG. 5B is a top plan view of the substrate 500 after provision of a molecular beam subsequent to the ion beam 506. As shown, a monolayer 514 selectively is formed along the sidewalls 510, but not along the endwalls 512. This is further shown in FIG. 5C, which depicts a side view (not a cross-section) of the substrate 500 at the same instance as that shown in FIG. 5B.

Figure 5C:
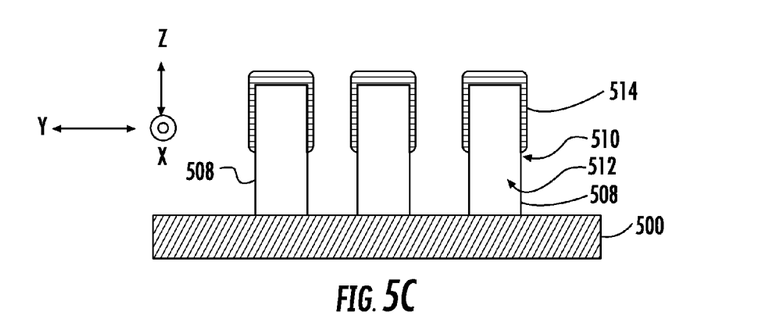
FIG. 5C depicts a side view of the substrate at the same instance as that shown in FIG. 5.

In the example of FIGS. 5B and 5C angled ions are used to selectively treat sidewalls 510 over endwalls 512 and to selectively treat upper portions of sidewalls with respect to lower portions of the sidewalls. Thus, the example of FIGS.

5B and 5C indicates a compound type of selectivity afforded by the present embodiments where just certain portions of certain sides of a substrate feature are treated. However, other embodiments provide other types of selectivity. For example, in one implementation whole sidewalls may be exposed to angled ions instead of upper regions of sidewalls alone.

Figure 6A:
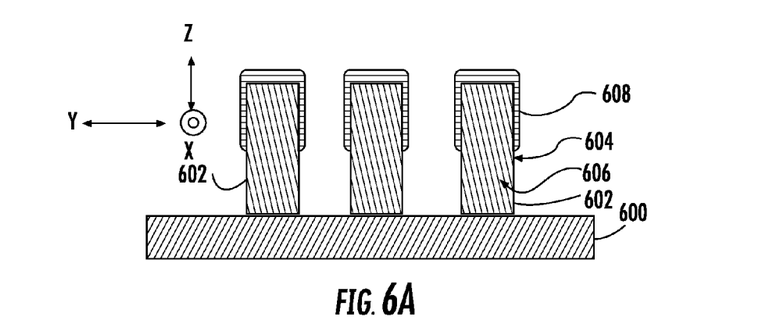
FIG. 6A and FIG. 6B depict a side view and end view, respectively of a substrate after treatment by multiple exposures to angled ions according to additional embodiments.
Figure 6B:
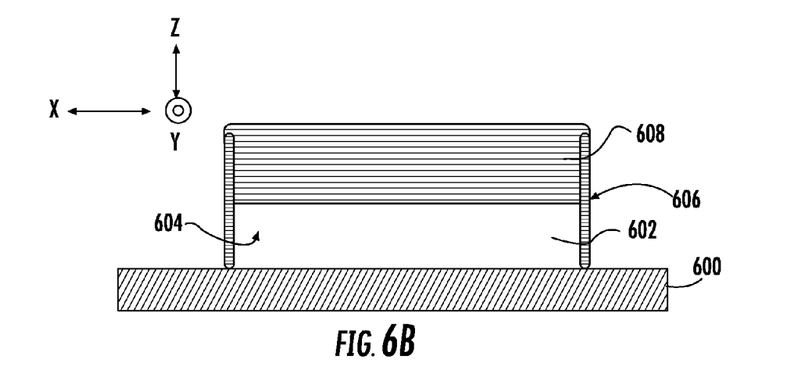

In other examples, whole endwalls may be exposed to angled ions while just upper regions of sidewalls are exposed to ions. FIG. 6A and FIG. 6B depict an example of this type of selective monolayer growth. FIG. 6A and FIG. 6B depict a side view and end view, respectively of a substrate 600 having substrate features 602 upon which a selective layer 608 is grown. The selective layer 608 may be a monolayer of plurality of monolayers that are grown in process as generally depicted in FIGS. 4A to 4C where selective growth is promoted by exposure to angled ions. As shown the selective layer 608 completely covers the endwalls 606 and covers upper portions of sidewalls 604. This may be accomplished by directing angled ions (not shown) through an extraction plate in a first exposure in which the endwalls 606 are arranged parallel to the trajectories of the angled ions, rotating the substrate 600 by 90 degrees within the X-Y plane, and directing angled ions in a second exposure in which the trajectories of angled ions are parallel to the sidewalls 604.

Moreover, instead of promoting monolayer-by-monolayer growth on certain sides of a substrate feature that are exposed to angled ions as shown in FIGS. 5B and 5C, angled ions may be used to suppress monolayer-by monolayer growth on those sides of a substrate feature exposed to the angled ions.

In other embodiments, instead of providing a beam of oxygen ions, angled nitrogen ions may be directed to substrate features to selectively form a sub-monolayer of nitride that is effective to react with silane to form a selectively deposited silicon nitride layer. Moreover, in other embodiments, instead of providing a molecular beam of silane, in the operation shown in FIG. 4C a molecular beam containing a dopant may be provided to react with an oxide sub-monolayer to form a selectively deposited layer of dopant oxide.

In the above manner, the present embodiments may be employed to selectively form layers in target portions of substrate features by employing angled ions. As noted the present embodiments provide flexibility to either enhance or suppress layer formation in portions that are impacted by ions. This allows different regions of substrate features to be targeted for selective growth, such as upper regions or lower regions of substrate features.

Although the above examples illustrated formation of silicon oxide, the present embodiments extend to formation of doped oxides, nitrides, and other materials that may be formed in a layer-by-layer process. In addition, the present embodiments may be employed to selectively deposit a layer stack of different materials on a substrate structure. Such a layer stack may include, for example, a doped oxide layer, and an encapsulating nitride layer, which may be employed in a process to form a doped region in underlying substrate features.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of selectively doping a three dimensional substrate feature on a substrate, comprising:
    exposing the substrate to an oxide plasma wherein the substrate feature is covered with a sub-monolayer of oxygen;
    directing an ion beam comprising angled ions to the substrate at a non-zero angle with respect to a perpendicular to a substrate plane when the substrate feature is covered with the sub-monolayer of oxygen, wherein a first portion of the substrate feature is exposed to the ion beam and wherein a second portion of the substrate feature is not exposed to the ion beam, wherein the sub-monolayer of oxygen is removed in the first portion and the sub-monolayer of oxygen remains in the second portion; and
    after the directing the ion beam, directing molecules of a molecular species that includes a dopant to the substrate wherein the molecules of the molecular species cover the substrate feature,
    wherein the directing the ion beam and directing the molecules generates selective growth of a dopant oxide layer comprising the dopant on the second portion but not on the first portion.

2. The method of claim 1 further comprising;
    depositing a sealing layer on the substrate; and
    annealing the substrate wherein a doped region is formed in the three dimensional substrate feature adjacent the second portion.

3. The method of claim 1, wherein the angled ions comprise hydrogen ions that are effective to react with oxygen to remove the oxygen in the exposed regions.

4. The method of claim 1, wherein the angled ions are inert gas ions having an ion energy and ion dose that is effective to remove the sub-monolayer of oxygen.

5. The method of claim 1,
    wherein the dopant oxide layer is a monolayer,
    wherein exposing the substrate to an oxide plasma, directing an ion beam comprising angled ions, and the directing molecules of a molecular species comprise a process cycle that is effective to selectively deposit a monolayer and,
    wherein the process cycle is repeated and wherein a plurality of monolayers are formed.

6. The method of claim 1, further comprising modifying a plasma sheath boundary to generate the angled ions.

7. The method of claim 1, wherein the angled ions comprise an ion angular distribution that has a bimodal distribution of angles of incidence.

8. The method of claim 1, wherein the bimodal distribution is characterized by a peak at +/−5 degrees with respect to the perpendicular.

* * * * *